US011811006B2

(12) United States Patent
Xia et al.

(10) Patent No.: US 11,811,006 B2
(45) Date of Patent: Nov. 7, 2023

(54) DISPLAY PANEL AND DISPLAY DEVICE

(71) Applicant: KunShan Go Visionox Opto Electronics Co., Ltd, Jiangsu (CN)

(72) Inventors: Peng Xia, Kunshan (CN); Shengzu Zhu, Kunshan (CN)

(73) Assignee: KunShan Go Visionox Opto Electronics Co., Ltd, Kunshan (CN)

( * ) Notice: Subject to any disclaimer, the term of this patent is extended or adjusted under 35 U.S.C. 154(b) by 273 days.

(21) Appl. No.: 17/363,550

(22) Filed: Jun. 30, 2021

(65) Prior Publication Data

US 2021/0328110 A1 Oct. 21, 2021

Related U.S. Application Data

(63) Continuation of application No. PCT/CN2020/075554, filed on Feb. 17, 2020.

(30) Foreign Application Priority Data

Jun. 24, 2019 (CN) .......................... 201910548586.8

(51) Int. Cl.
*G06F 3/041* (2006.01)
*H01L 33/48* (2010.01)
(Continued)

(52) U.S. Cl.
CPC ............ *H01L 33/483* (2013.01); *G06F 3/041* (2013.01); *H01L 23/60* (2013.01); *H01L 33/62* (2013.01)

(58) Field of Classification Search
CPC ....... H01L 33/483; H01L 23/60; H01L 33/62; H01L 25/0753; G06F 3/041;
(Continued)

(56) References Cited

U.S. PATENT DOCUMENTS

2017/0308201 A1* 10/2017 Xie ...................... G06F 3/0443
2017/0317157 A1* 11/2017 Li ....................... H10K 50/8423
(Continued)

FOREIGN PATENT DOCUMENTS

CN 104464533 A 3/2015
CN 104536610 A 4/2015
(Continued)

OTHER PUBLICATIONS

PCT International Search Report for PCT/CN2020/075554, dated May 21, 2020, 12 pages.

(Continued)

*Primary Examiner* — Temesghen Ghebretinsae
*Assistant Examiner* — Sosina Abebe
(74) *Attorney, Agent, or Firm* — Maier & Maier, PLLC

(57) ABSTRACT

A display panel and a display device. The display panel has a display area and a packaging area located on an outer periphery of the display area, and the display panel includes: an array substrate provided with pixel units distributed in an array and corresponding to the display area; the cover plate disposed opposite to the array substrate, the cover plate including a first substrate, a signal wire layer and an insulating layer formed on the first substrate, wherein the insulating layer covers the signal wire layer, wherein the signal wire layer includes a plurality of touch electrodes and a signal wire electrically connected to the touch electrodes and the signal wire is at least partially located in the packaging area; a packaging adhesive layer disposed between the cover plate and the array substrate to bond the cover plate and the array substrate.

13 Claims, 4 Drawing Sheets

(51) Int. Cl.
    *H01L 23/60*     (2006.01)
    *H01L 33/62*     (2010.01)

(58) Field of Classification Search
    CPC ... G06F 3/04164; G06F 3/0412; H10K 59/00;
               H10K 59/12; H10K 59/1315; H10K 59/88
    See application file for complete search history.

(56)                   References Cited

U.S. PATENT DOCUMENTS

| | | | |
|---|---|---|---|
| 2018/0069054 A1* | 3/2018 | Zhai | G06F 3/041 |
| 2019/0067218 A1* | 2/2019 | Lin | H01L 27/0292 |
| 2020/0185639 A1* | 6/2020 | Fujii | H10K 59/12 |

FOREIGN PATENT DOCUMENTS

| | | | |
|---|---|---|---|
| CN | 105159515 A | 12/2015 | |
| CN | 105739154 A | 7/2016 | |
| CN | 108011051 A | 5/2018 | |
| CN | 109656401 A | 4/2019 | |
| CN | 110289289 A | 9/2019 | |

OTHER PUBLICATIONS

The first office action and search report dated Oct. 10, 2020 for Chinese Application No. 201910548586.8, 7 pages.

\* cited by examiner

DISPLAY PANEL AND DISPLAY DEVICE

CROSS-REFERENCE TO RELATED APPLICATION

This application is a continuation of International Application No. PCT/CN2020/075554, filed on Feb. 17, 2020, which claims priority from Chinese patent application No. 201910548586.8, entitled "DISPLAY PANEL AND DISPLAY DEVICE", filed on Jun. 24, 2019, both of which are incorporated herein by reference in their entireties.

TECHNICAL FIELD

The present disclosure relates to a display technology, and particularly, to a display panel and a display device.

BACKGROUND

Organic Light Emitting Diode (OLED) display has the advantages of low cost, wide viewing angle, low driving voltage, fast response speed, rich light-emitting color, simple manufacturing process, large-area flexible display, etc., so it is considered to be one of the most promising display technologies.

With the development of technology, users have higher requirements for high screen-to-body ratio and narrow frames of display devices such as mobile phones. How to reduce the frame of the display device to achieve a high screen-to-body ratio has become an urgent problem to be solved.

SUMMARY

Embodiments of the present disclosure provide a display panel and a display device, which can reduce the frame size of the display panel and achieve a high screen-to-body ratio.

In one aspect, an embodiment of the present disclosure proposes a display panel having a display area and a packaging area located on the outer periphery of the display area, and the display panel includes: an array substrate provided with pixel units distributed in an array and corresponding to the display area; a cover plate disposed opposite to the array substrate, wherein the cover plate includes a first substrate, a signal wire layer and an insulating layer formed on the first substrate, wherein the insulating layer covers the signal wire layer, wherein the signal wire layer includes a plurality of touch electrodes and a signal wire electrically connected to the touch electrodes and the signal wire is at least partially located in the packaging area; a packaging adhesive layer located in the packaging area, the packaging adhesive layer is disposed between the cover plate and the array substrate to bond the cover plate and the array substrate, wherein the projection pattern formed by the orthographic projection of the packaging adhesive layer in a thickness direction of the cover plate at least partially overlaps the signal wire.

In another aspect, an embodiment of the present disclosure provides a display device including the said display panel.

In the display panel provided by the embodiment of the present disclosure, at least part of the signal wire and the insulating layer are located in the packaging area; the packaging area is provided with a packaging adhesive layer, and the projection pattern formed by the orthographic projection of the packaging adhesive layer in the thickness direction of the cover plate at least partially overlaps the insulating layer and the signal wire; compared with the signal wire and the packaging adhesive layer disposing in parallel, the frame width is smaller. For the same number of the signal wire, part of the number of the signal wire may be arranged in the package area in this embodiment, thereby reducing the width of the wiring area; or, for the signal wire with a same width, in this embodiment, a part of the signal wire itself may be disposed in the packaging area, thereby reducing the width of the frame area occupied by the signal wire, thereby effectively reducing the frame width of the display panel and correspondingly increasing the width of the display area in the display panel, which increases the screen-to-body ratio.

BRIEF DESCRIPTION OF THE DRAWINGS

The following will briefly introduce the drawings that need to be used in the embodiments of the application. For those skilled in the art, other drawings may be obtained based on these drawings without creative work.

DETAILED DESCRIPTION

Figure 1:
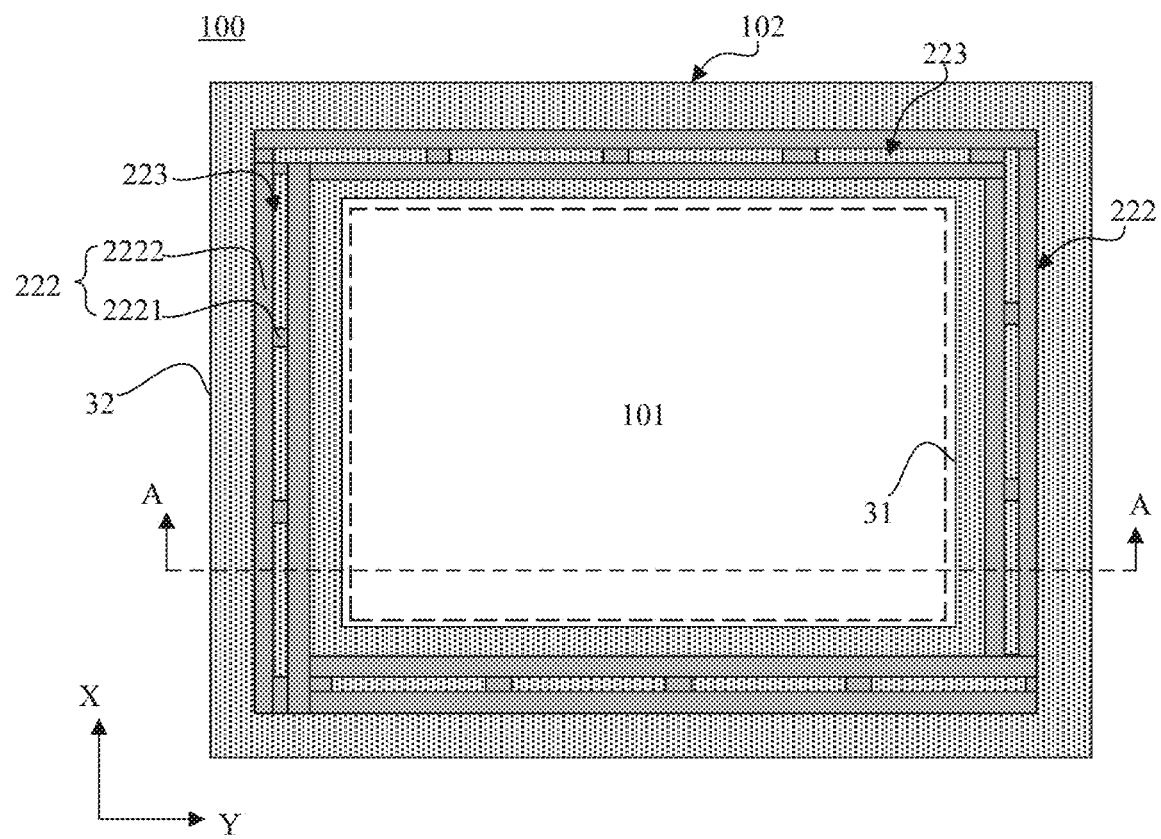
FIG. 1 is a top view of a display panel provided by an embodiment of the present disclosure.

The features and exemplary embodiments of various aspects of the present disclosure will be described in detail below. In the following detailed description, specific details are proposed in order to provide a comprehensive understanding of this application. However, it is obvious to those skilled in the art that this application may be implemented without some of these specific details. The following description of the embodiments is only for a better understanding of the present disclosure by showing examples of the present disclosure. In the drawings and the following description, at least part of the prior structures and technologies are not shown in order to avoid unnecessary obscurity of the present disclosure; and, for clarity, the size of some structures may be exaggerated. In addition, the features, structures or characteristics described below may be combined in one or more embodiments in any suitable manner.

In order to better understand the present disclosure, the display panel and the display device according to an embodiment of the present disclosure will be described in detail below with reference to FIGS. 1 to 7. In order to easily reflect the structure of each part of the embodiment of the present disclosure, some structures in the figures are hidden or drawn transparently.

Figure 2:
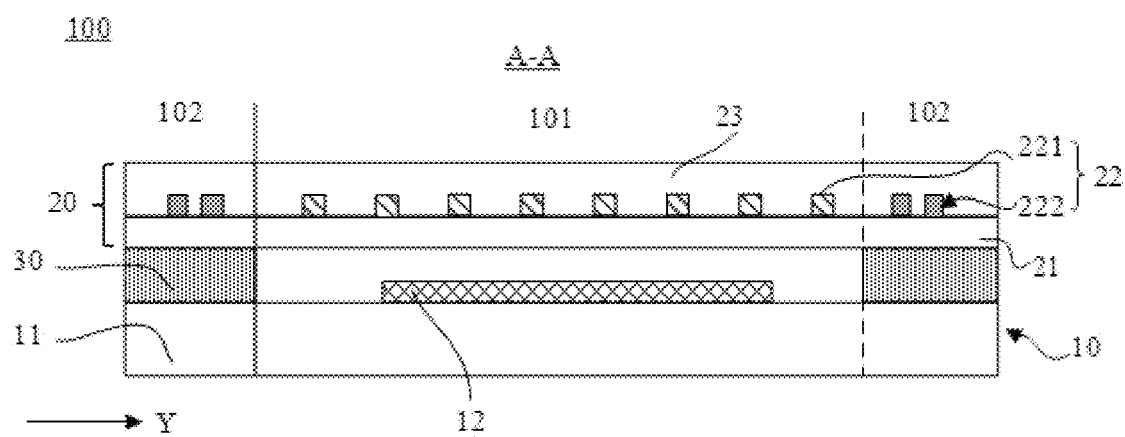
FIG. 2 is a cross-sectional view along an A-A direction in FIG. 1.

Referring FIGS. 1 to 2 together, FIG. 1 shows a top view of a display panel provided by an embodiment of the present disclosure, and FIG. 2 shows a cross-sectional view along an A-A direction in FIG. 1.

An embodiment of the present disclosure provides a display panel 100 having a display area 101 and a packaging area 102 located on the outer periphery of the display area 101. The display panel 100 includes an array substrate 10, a cover plate 20, and a packaging adhesive layer 30. The array substrate 10 is provided with pixel units (not shown in the figures) distributed in an array and corresponding to the display area 101. The cover plate 20 is disposed opposite to the array substrate 10. The cover plate 20 includes a first substrate 21, a signal wire layer 22 and an insulating layer 23 formed on the first substrate 21, wherein the insulating layer 23 covers the signal wire layer 22. The signal wire layer 22 includes a plurality of touch electrodes 221 and a signal wire 222 electrically connected to the touch electrodes 221, and the signal wire 222 is at least partially located in the packaging area 102. The packaging adhesive layer 30 is located in the packaging area 102 and the packaging adhesive layer 30 is disposed between the cover plate 20 and the array substrate 10 to bond the cover plate 20 and the array substrate 10, wherein the projection pattern formed by the orthographic projection of the packaging adhesive layer 30 in a thickness direction of the cover plate 20 at least partially overlaps the signal wire 222.

In the display panel 100 provided by the embodiment of the present disclosure, the projection pattern formed by the orthographic projection of the packaging adhesive layer 30 in the thickness direction of the cover plate 20 at least partially overlaps the signal wire 222; therefore, compared to disposing a signal wire 22 and a packaging adhesive layer 30 in parallel and spaced apart in a direction parallel to a plane of the cover plate 20, the width of the frame area occupied by the signal wire 222 can be reduced, thus effectively reducing the frame width of the display panel 100 and correspondingly increasing the width of the display area 101 in the display panel 100, which increases the screen-to-body ratio.

In some embodiments, the array substrate 10 may include a second substrate 11, a buffer layer, and a device layer 12 stacked in sequence, wherein the device layer 12 includes a plurality of pixel units, a pixel circuit layer for driving each pixel unit, and a plurality of functional elements. The pixel circuit layer includes a scan wire, a data wire and a power wire, and the plurality of functional elements at least include a switching transistor, a driving transistor and a storage capacitor. The said pixel circuit layer is connected to the plurality of pixel units in the array substrate 10 through the said plurality of functional elements, thereby driving the pixel units to emit light.

The scan wire, the data wire, and the power wire may be made of conductive materials, such as metal or indium tin oxide (ITO). The said different components may be made of different conductive materials. For example, in some embodiments, the scan wire and the power wire are made of molybdenum material, and the data wire may be made of titanium, aluminum, and other materials.

In some embodiments, the display panel 100 is a touch display panel, and the plurality of touch electrodes 221 of the display panel 100 are coupled to the display area 101 of the array substrate 10, so that the display area 101 of the array substrate 10 is configured as a sensing area of the touch electrode 221 of the touch display panel or that the display area 101 operates. When an user touches the display panel 100 so that the touch electrode 221 senses the change of the electric signal in the cover plate 20, the pixel units of the display area 101 are controlled to emit light or the brightness of each pixel units is adjusted.

Referring to FIG. 2, in some optional embodiments, on the frame of the display panel 100, a cross section of a projection of the packaging area 30 in the thickness direction of the cover plate 20 is in a ring structure, and an inner contour 31 and an outer contour 32 of the projected figure are both rectangular. The width of the packaging adhesive layer 30 is 300 µm~3000 µm, and further, the width of the packaging adhesive layer 30 is 500 µm~1500 µm, wherein the width of the packaging adhesive layer 30 is the extension distance of the projection of the packaging adhesive layer 30 in a thickness direction of the display panel 100 in a second direction Y, which is perpendicular to the thickness direction of the cover plate 20. By appropriately setting the width of the packaging adhesive layer 30 to effectively prevent external oxygen or water vapor from entering the inside of the display panel, the packaging effect of the display panel is improved. Specifically, in the thickness direction of the display panel 100, the width of the packaging area 30 may not be completely the same. In some embodiments, the width of the packaging adhesive layer 30 on the contact surface between the packaging adhesive layer 30 and the array substrate 10 or the cover plate 20 is the largest, which can effectively improve the sealing performance of the display panel 100.

In some embodiments, the packaging area 30 is formed of a packaging material. Optionally, the packaging material may be a glass powder, a welding material, or a packaging material containing glass particles. The glass particles may contain one or more of the following compounds: magnesium oxide, calcium oxide, barium oxide, lithium oxide, sodium oxide, potassium oxide, boron oxide, vanadium pentoxide, zinc oxide, aluminum oxide, silicon dioxide, lead oxide, tin oxide, phosphorus pentoxide, lead borate glass, tin phosphate glass, vanadate glass, borosilicate, etc. The average diameter of the glass particles is in the range of approximately 2 µm~30 µm, and further, the average diameter of the glass particles may be 5 µm to 10 µm, which may be adjusted according to requirements. In the embodiments of the present disclosure, the packaging material being glass powder is taken as an example for description.

For example, when the packaging adhesive layer 30 is glass glue made of glass powder, the packaging process can be as follows: first applying the glass powder on an area of the cover plate 20 for packaging; and then docking the cover plate 20 with the array substrate 10 so that the portion of the cover plate 20 in the packaging area 102 corresponds to the portion of the array substrate 10 in the packaging area 102; sintering the glass powder by laser to solidify the glass powder, wherein, specifically, the laser may pass through the cover plate 20, and the glass powder disposed between the cover plate 20 and the array substrate 10 is sintered to form the glass glue, thereby packaging the array substrate 10 and the cover plate 20.

Since at least part of the signal wire 222 in the cover plate 20 is located in the packaging area 102, and the signal wire 222 may be made of metals such as titanium, aluminum, molybdenum-aluminum-molybdenum (Mo—Al—Mo), etc., the metal signal wire 222 may affect the laser sintering during the laser sintering of the packaging material. In order to reduce the influence of the signal wire 222 located in the packaging area 102 on the packaging effect, in some optional embodiments, in the packaging area 102, the signal wire 222 has a plurality of light-transmitting areas 223 sequentially distributed in an extending direction of the signal wire 222 and the light-transmitting areas 223 are filled with the insulating layer 23.

In specific implementation, when the glass powder is sintered by laser, the signal wire 222 located in the packaging area 102 will reflect the laser, so that the laser passing through the cover plate 20 is reduced, and the curing effect of the packaging adhesive is affected; by providing the signal wire 222 having the plurality of light-transmitting areas 223 sequentially distributed in the extending direction thereof, wherein the light-transmitting areas 223 are hollow areas penetrating the signal wire 222 in a thickness direction, during the laser sintering process, the laser can pass through the cover plate 20 through the light-transmitting areas 223 to sinter the packaging material. Therefore, the plurality of light-transmitting areas 223 on the signal wire 222 can increase the transmittance of the laser and reduce the reflection of the laser, thereby improving the packaging effect of the display panel 100. Meanwhile, by providing the insulating layer 23 and filling the insulating layer into the light-transmitting areas 223, the insulation performance between the signal wires 222 is improved, the signal interference between the signal wire 222 is reduced, and the stability of the display panel 100 is improved.

Optionally, the signal wire 222 and the packaging adhesive layer 30 are both disposed around the outer peripheral side of the display area 101. In all directions on the outer peripheral side of the display area 101, the orthographic projection of the packaging adhesive layer 30 in the thickness direction of the cover plate 20 at least partially overlaps the signal wire 222. The light-transmitting areas 223 on the signal wire 222 are evenly disposed around the outer peripheral side of the display area 101, thereby achieving a better packaging effect of the entire packaging adhesive layer 30, while reducing the width of multiple frames on the outer peripheral side of the display area 101.

In some optional embodiments, in the package area 102, the signal wire 222 includes a plurality of first signal wires 2221 and a plurality of second signal wires 2222, wherein an extending direction of the first signal wire 2221 intersect an extending direction of the second signal wire 2222, wherein gaps are formed between the plurality of first signal wires 2221, gaps are formed between the plurality of second signal wires 2222, and the plurality of first signal wires 2221 are disposed between two adjacent second signal wires 2222, so that the plurality of the first signal wires 2221 are in contact with the two adjacent second signal wires 2222 to form light-transmitting areas 223. In order to illustrate the structure of the display panel 100 of the embodiment of the present disclosure more clearly, the frame on one side of the display panel 100 is taken as an example for description in this embodiment of the present disclosure.

Referring to FIG. 1, the left side frame in the display panel 100 is taken as an example for description. In a column direction of the display panel 100, namely in a first direction X, the signal wire 222 includes a plurality of second signal wires 2222, and gaps are formed between the plurality of second signal wires 2222; in a row direction of the display panel 100, namely in the second direction Y, the signal wire 222 includes a plurality of first signal wires 2221, and gaps are formed between the plurality of first signal wires 2221; and the plurality of first signal wires 2221 are provided between two adjacent second signal wires 2222, so that the plurality of first signal wires 2221 are in contact with the two adjacent second signal wires 2222 to form light-transmitting areas 223. The electrical connection between the first signal wires 2221 and second signal wires 2222 can reduce the impedance compared to a single second signal wire 2222 or a single first signal wire 2221.

In specific implementation, the number of the first signal wires 2221 and the second signal wires 2222 can be adjusted according to requirements. In some optional embodiments, in the column direction of the display panel 100, the number of the second signal wires 2222 may be two and the two second signal wires 2222 are disposed in parallel, wherein a plurality of first signal wires 2221 parallel to each other are disposed between the two second signal wires 2222 to form rectangular light-transmitting areas 223 so as to increase the transmittance of the laser through the cover plate 20, thereby improving the packaging effect of the packaging adhesive layer 30.

As an optional implementation manner, the signal wire 222 may be one signal wire 222, and a plurality of through holes distributed in sequence are formed in the thickness direction of the signal wire 222 through a patterning process. The through holes are the light-transmitting areas 223, and the amount of laser passing through the cover plate 20 is increased through the light-transmitting areas 223, so as to better sinter the glass powder disposed between the cover plate 20 and the array substrate 10.

Figure 3:
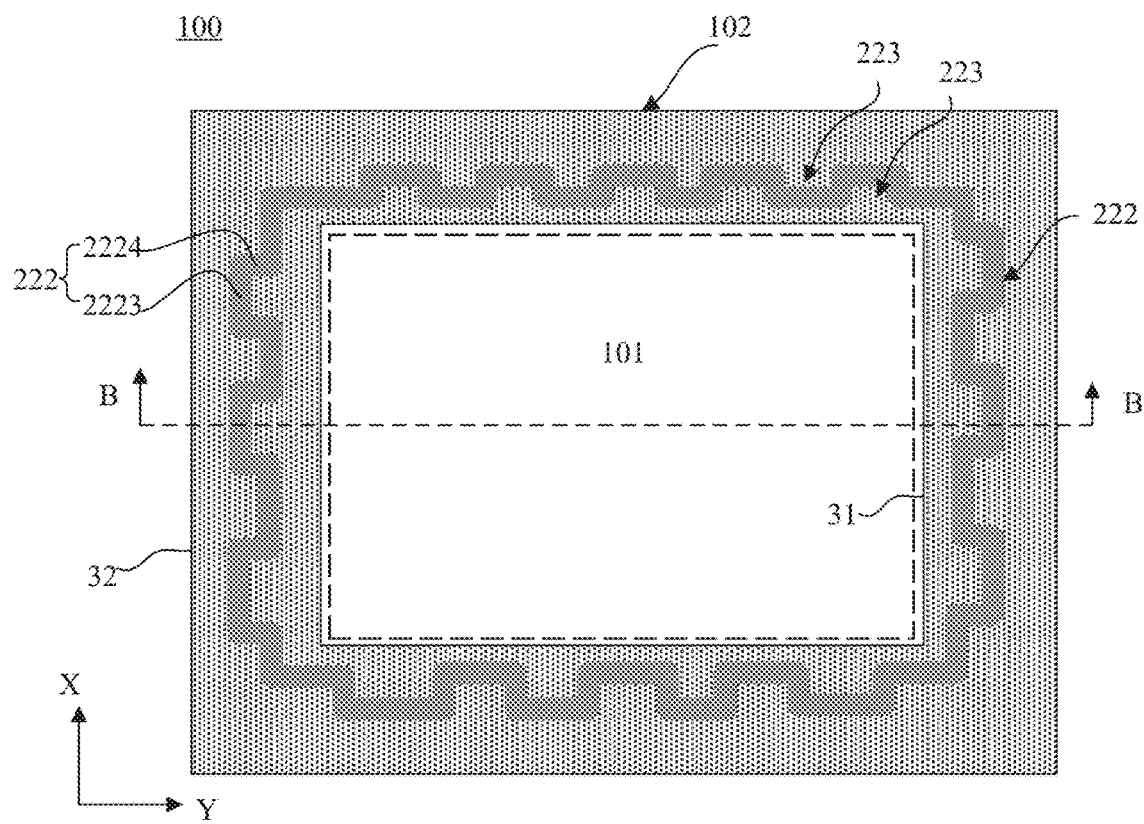
FIG. 3 is a top view of a display panel provided by another embodiment of the present disclosure, which differs from the embodiment as shown in FIG. 1-FIG. 2 in the shape of the signal wire.
Figure 4:
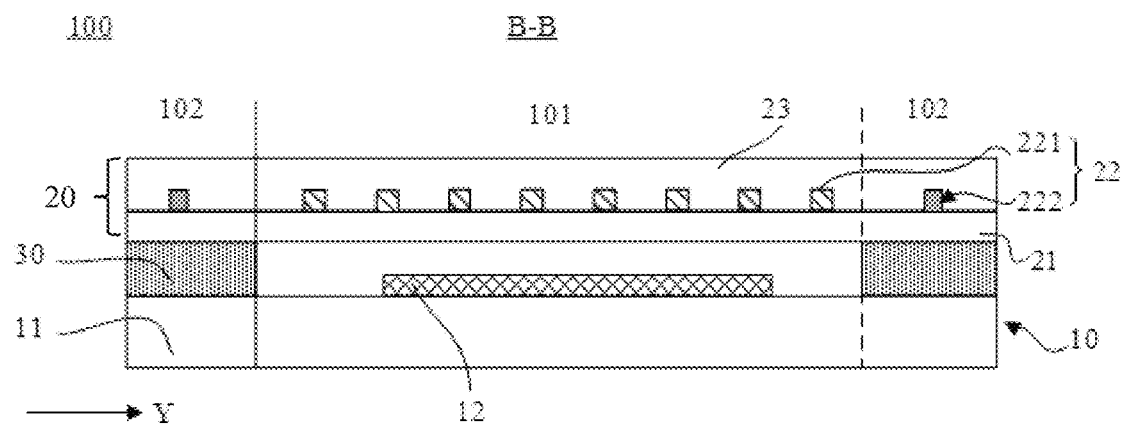
FIG. 4 is a cross-sectional view along a B-B direction in FIG. 3.

Referring FIGS. 3 to 4 together, FIG. 3 shows a top view of a display panel provided by another embodiment of the present disclosure, and FIG. 4 shows a cross-sectional view along a B-B direction in FIG. 3.

An embodiment of the present disclosure provides a display panel 100 including an array substrate 10, a cover plate 20, and a packaging adhesive layer 30. The structures of the array substrate 10 and the packaging adhesive layer 30 are the same as those of the foregoing embodiment, and will not be repeated here.

The cover plate 20 includes a first substrate 21, a signal wire layer 22 and an insulating layer 23 formed on the first substrate 21, wherein the insulating layer 23 covers the signal wire layer 22. The signal wire layer 22 includes a plurality of touch electrodes 221 and a signal wire 222 electrically connecting to the touch electrodes 221, and the signal wire 222 is at least partially located in the packaging area 102, wherein the projection pattern formed by the orthographic projection of the packaging adhesive layer 30 in the thickness direction of the cover plate 20 at least partially overlaps the signal wire 222.

The display panel 100 provided by the embodiment of the present disclosure can reduce the width of the frame area occupied by the signal wire 222, thereby effectively reducing the frame width of the display panel 100 and correspondingly increasing the width of the display area 101 in the display panel 100, which increases the screen-to-body ratio.

In some optional embodiments, the signal wire 222 extends in a wave shape, and light-transmitting areas 223 with a tooth-like structure are formed between the signal wire 222 and the outer contour 32 of the projection pattern; and/or, light-transmitting areas 223 with a tooth-like structure are formed between the signal wire 222 and the inner contour 31 of the projection pattern.

Optionally, the projection pattern formed by the orthographic projection of the packaging adhesive layer 30 in the thickness direction of the cover plate 20 completely overlaps the signal wire 222, and the projection pattern formed by the orthographic projection of the packaging adhesive layer 30 in the thickness direction of the cover plate 20 is a ring structure, wherein the inner contour 31 and the outer contour 32 of the projection pattern are both rectangular. By designing the signal wire 222 into a wave shape, the edge line of the orthographic projection of the signal wire 222 in the thickness direction of the cover plate 20 is not parallel to the outer contour 32 and the inner contour 31 of the projection pattern, so that the light-transmitting areas 223 with a tooth-like structure are formed between the signal wire 222 and the outer contour 32 of the projection pattern and between the signal wire 222 and the inner contour 31 of the projection pattern, so as to increase the amount of laser passing through the cover plate 20 and reduce the reflection effect of the signal wire 222 on the laser; meanwhile, the packaging effect of the packaging adhesive can be improved. The tooth-like structure here can be any one or a combination of a saw-tooth structure, a tooth-shaped structure formed by a smooth transition curve, and a rectangular tooth-shaped structure. In some optional embodiments, the structure of the packaging adhesive layer 30 or the extending direction of the signal wire 222 may also be designed so that a light-transmitting area 223 with a tooth-like structure is formed between the signal wire 222 and one of the contours of the projected pattern, that is, the inner contour 31 or the outer contour 32.

In an optional embodiment, the signal wire 222 includes a first signal wire segment 2223 and a second signal wire segment 2224, wherein the first signal wire segment 2223 extends in the first direction X and the second signal wire segment 2224 extends in the second direction Y. The first signal wire segment 2223 and the second signal wire segment 2224 are sequentially connected end to end, so that light-transmitting areas 223 with a tooth structure are formed both between the signal wire 222 and the outer contour 32 of the projection pattern and between the signal wire 222 and the inner contour 31 of the projection pattern, wherein the first direction X and the second direction Y intersect each other. Optionally, the angle between the first direction X and the second direction Y is 90 degrees. The first signal wire segment 2223 and the second signal wire segment 2224 extend in different directions, and the first signal wire segment 2223 and the second signal wire segment 2224 are sequentially connected end to end, so that the signal wire 222 forms a uniform wave-shaped structure, which can make an area having light-transmitting areas 223 with a tooth-like structure more uniform. Therefore, the amount of laser passing through the light-transmitting areas 223 is more uniform, so that the packaging material is sintered by laser uniformly. The first direction X may be a linear extending direction, or a curved extending direction.

Optionally, as shown in FIG. 3, the first direction X is a width direction of the display panel 100, and the second direction Y is a length direction of the display panel 100. The first signal wire segment 2223 and the second signal wire segment 2224 are sequentially connected end to end, so that light-transmitting areas 23 with a tooth-like structure are formed between the signal wire 222 and the outer contour 32 of the projection pattern and between the signal wire 222 and the inner contour 31 of the projection pattern. When the laser moves in the length direction of the display panel 100 (the second direction Y) to sinter the glass powder, the laser passes through the light-transmitting areas 223 with a tooth-like structure to sinter the glass powder, so as to increase sintering effect of the glass powder arranged in the second direction Y. In some embodiments, the angle between the first signal wire segment 2223 and the second signal wire segment 2224 on the cover plate 20 is 90 degrees to increase the area of the light-transmitting areas 223 and reduce the influence of the signal wire 222 on the transmission of laser.

Optionally, in the package area 102, the signal wire 222 includes a ground wire. By disposing the ground wire in the packaging area 102, the influence of the laser on the touch electrode 221 and other functional wires can be reduced. By providing a ground wire on the display panel 100, the static electricity generated when the user touches the display panel 100 can be derived out through the ground wire, which improves the accuracy and stability of the display panel 100 in use.

Combining the foregoing possible implementations, the signal wire 222 can be one or a combination of a linear structure, a curved structure and a zigzag structure; by appropriately configuring the structure of the signal wire 222, the number and the area of light-transmitting areas 223 formed between the signal wire 222 can be increased, and the amount of light transmitted by the transparent cover plate 20 can be further increased. Meanwhile, possible damages to the signal wire 222 during the laser sintering process can also be effectively reduced.

Figure 5:
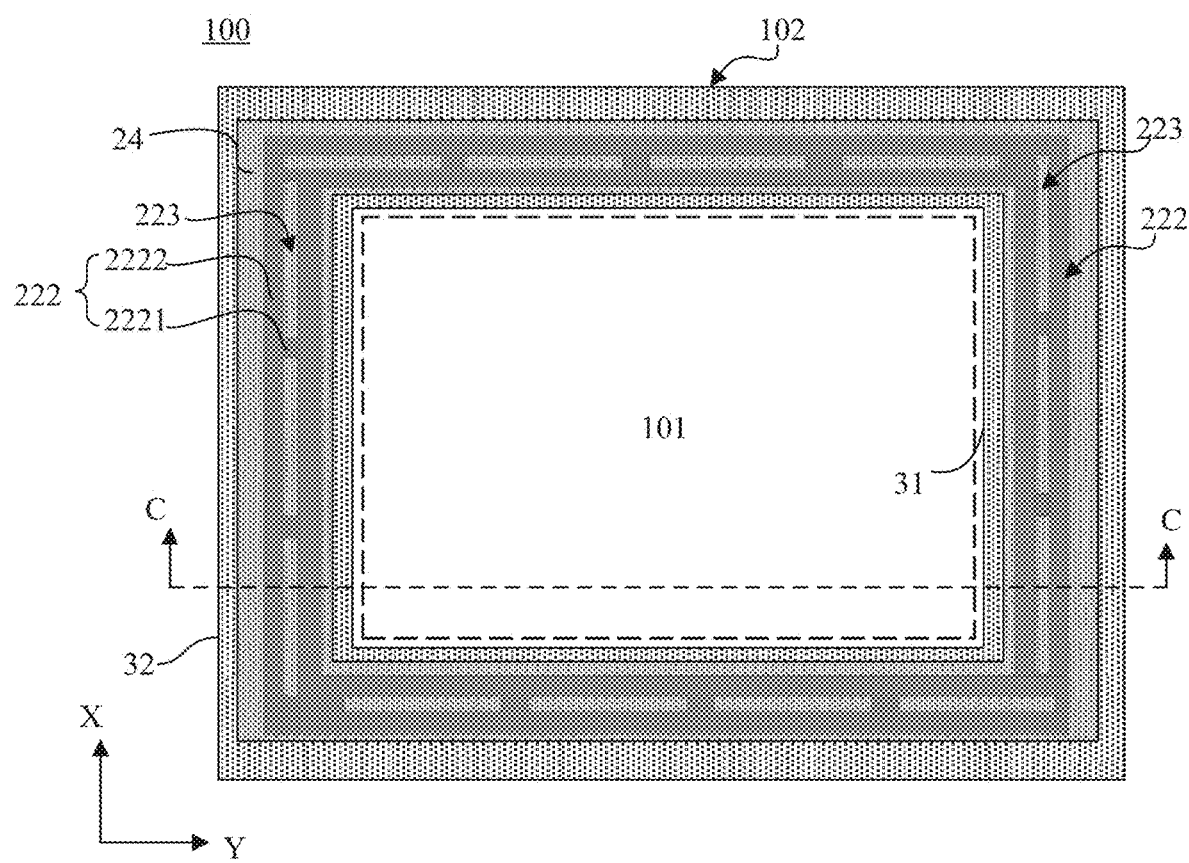
FIG. 5 is a top view of a display panel provided by another embodiment of the present disclosure, which further includes a conductive layer, or further includes a conductive layer and a protective layer, or further includes a conductive layer, a protective layer and an auxiliary metal layer, compared to the embodiment as shown in FIG. 1-FIG. 2.
Figure 6:
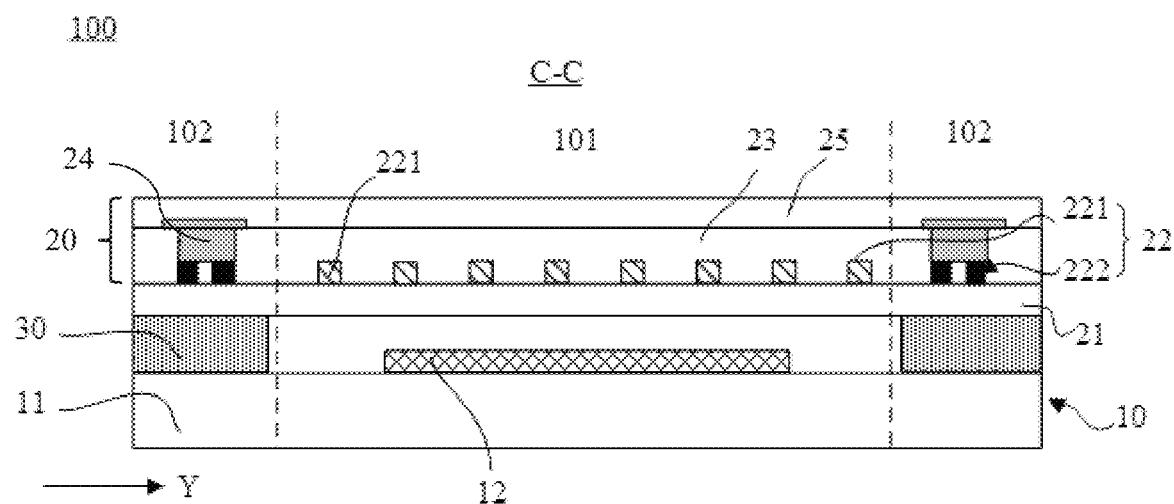
FIG. 6 is a cross-sectional view along a C-C direction of the first type of the display panel shown in FIG. 5.
Figure 7:
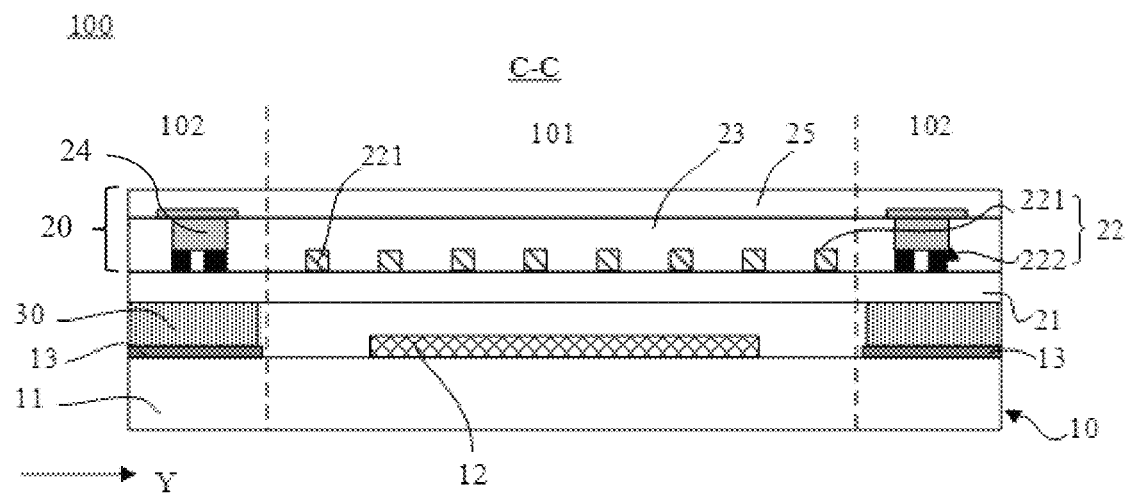
FIG. 7 is a cross-sectional view along the C-C direction of the second type of the display panel shown in FIG. 5.

Please refer to FIGS. 5 to 7 together. FIG. 5 shows a top view of a display panel provided by another embodiment of the present disclosure; FIG. 6 shows a cross-sectional view along a C-C direction of the first type of the display panel shown in FIG. 5; FIG. 7 shows a cross-sectional view along the C-C direction of the second type of the display panel shown in FIG. 5.

An embodiment of the present disclosure provides a display panel 100, which includes an array substrate 10, a cover plate 20, and a packaging adhesive layer 30. The structure of the packaging adhesive layer 30 may be the same as the structure of the foregoing embodiment, and will not be repeated.

Combining the foregoing possible implementations, the cover plate 20 may also include a conductive layer 24 disposed in the packaging area 102, the conductive layer 24 is disposed on a side of the signal wire layer 22 away from the first substrate 21, and the conductive layer 24 covers the signal wire 222 located in the packaging area 102 and is electrically connected to the signal wire 222; optionally, the conductive layer 24 is made of indium tin oxide. Since the conductive layer 24 is provided in the packaging area 102 and the conductive layer 24 covers the signal wire 222, such as a grounding wire, disposed in the packaging area 102, the thickness of the signal wire 222 in the packaging area 102 may be increased, thereby reducing the wiring impedance of the grounding wire and improving the efficiency of electrostatic discharge while achieving a narrow frame.

In some optional embodiments, the cover plate 20 further includes a protective layer 25, wherein the protective layer 25 is disposed on a side of the conductive layer 24 away from the first substrate 21, and at least a part of the conductive layer 24 is embedded in the protective layer 25. By providing a protective layer 25 on the cover plate 20, the signal wire layer 22 on the cover plate 20, such as the touch electrode 221, the signal wire 222 located in the packaging area 102 and the conductive layer 24 are protected, and the service life of the display panel 100 is improved. Optionally, in some embodiments, when the conductive layer 24 is not provided on the cover plate 20, the protective layer 25 may be directly provided on a side of the insulating layer 23 away from the first substrate 21 to protect the touch electrodes 221 and the signal wire 222 located in the packaging area 102.

In order to absorb more laser light by the packaging material, in some optional embodiments, an auxiliary metal layer 13 is provided on a side of the array substrate 10 facing the cover plate 20, and the projection of the auxiliary metal layer 13 on the cover plate 20 at least partially overlaps the projection of the packaging adhesive layer 30 on the cover plate 20.

In some optional embodiments, the array substrate 10 includes a plurality of metal wires located in the packaging area 102, and these metal wires may be any metal wires provided in the packaging area 102 of the array substrate 10. In some optional embodiments, the metal wires on the array substrate 10 include a cathode signal wire, which is electrically connected to the cathode layer located in the display area 101 and provide electrical signals for driving the cathode to the cathode layer. The material of the cathode signal wire can be a titanium-aluminum-titanium (Ti—Al—Ti) composite material, which has good electrical conductivity.

The auxiliary metal layer 13 may be disposed in the same layer as any of the metal wires of the array substrate 10 located in the packaging area 102, for example, disposed in the same layer as the cathode signal wire; and compared with cathode signal wire, in the second direction Y, the auxiliary metal layer 13 is closer to the packaging adhesive layer 30, which can improve the reflection effect of the auxiliary metal layer 13 on the laser, so as to improve the sintering effect of the laser on the glass powder. In an optional embodiment, the auxiliary metal layer 13 and the cathode signal wire are disposed in a same layer; such an arrangement can reduce the manufacturing process of separately manufacturing the auxiliary metal layer 13 and improve the manufacturing efficiency of the display panel 100.

Since the material of the auxiliary metal layer 13 may be metal, for example, it may be metal molybdenum, so that the auxiliary metal layer 13 can reflect laser, and the reflected laser irradiates the packaging adhesive layer 30 again to increase the irradiation temperature and promote the laser absorbing ability of the packaging adhesive layer 30, thereby achieving a better melting effect. In the thickness direction of the display panel 100, when the laser is irradiated from an upper side of the cover plate 20, the laser passing through the cover plate 20 can sinter the packaging material. In order to improve the utilization of the laser, an auxiliary metal layer 13 is provided on the cover plate 20, and the laser passing through the cover plate 20 enters the packaging material under the reflection of the auxiliary metal layer 13 to sinter the packaging material, which further improves the sintering effect of the packaging material and improves the packaging effect of the packaging adhesive layer 30 on the display panel 100.

In summary, in the display panel 100 provided by the embodiment of the present disclosure, at least part of the signal wire 222 and the insulating layer 23 are located in the packaging area 102; the packaging area 102 is provided with a packaging adhesive layer 30, and the projection pattern formed by the orthographic projection of the packaging adhesive layer 30 in the thickness direction of the cover plate 20 at least partially overlaps the insulating layer 23 and the signal wire 222; compared with the signal wire 222 and the packaging adhesive layer 30 disposing in parallel, the frame width is smaller. For the same number of signal wires 222, in this embodiment, a part of the number of signal wires 222 may be disposed in the packaging area 102, thereby reducing the width of the frame area; or, for the signal wire 222 with a same width, in this embodiment, a part of the signal wire 222 itself may be disposed in the packaging area 102, thereby reducing the width of the wiring area occupied by the signal wire 222, thereby effectively reducing the frame width of the display panel 100 and correspondingly increasing the width of the display area 101 in the display panel 100, which increases the screen-to-body ratio. Therefore, the user experience improves, so it is easy to promote and use.

An embodiment of the present disclosure also provides a display device including the display panel 100 of the foregoing embodiments. In some embodiments, the display device is a micro light emitting diode display device. The display device provided by the embodiment of the present disclosure has the advantages of a narrow frame and a high screen-to-body ratio.

This present disclosure can be implemented in other specific forms without departing from its spirit and essential characteristics. Therefore, the current embodiments are regarded as illustrative rather than restrictive in all aspects, and the scope of this application is defined by the appended claims rather than the foregoing description, and all modifications that fall within the meaning of the claims and the scope of equivalents are thus included in the scope of the present application. Moreover, different technical features appearing in different embodiments can be combined to achieve beneficial effects. Those skilled in the art should be able to understand and implement other modified embodiments of the disclosed embodiments on the basis of studying the drawings, the description and the claims.

What is claimed is:

1. A display panel, having a display area and a packaging area located on an outer periphery of the display area, and the display panel comprising:
   an array substrate provided with pixel units distributed in an array and corresponding to the display area;
   a cover plate disposed opposite to the array substrate, the cover plate comprising a first substrate, a signal wire layer, and an insulating layer formed on the first substrate, wherein the insulating layer covers the signal wire layer, the signal wire layer comprises a plurality of touch electrodes and a signal wire electrically connected to the plurality of touch electrodes, and the signal wire is at least partially located in the packaging area, the signal wire further comprises, in the packaging area, a plurality of first signal wires and a plurality of second signal wires, and an extending direction of the plurality of first signal wires intersects an extending direction of the plurality of second signal wires, gaps are formed between the plurality of first signal wires, gaps are formed between the plurality of second signal wires, and the plurality of first signal wires are disposed between two adjacent second signal wires, wherein the plurality of the first signal wires is in contact with the two adjacent second signal wires to form a plurality of light-transmitting areas; and
   a packaging adhesive layer located in the packaging area, wherein the packaging adhesive layer is disposed between the cover plate and the array substrate to bond the cover plate and the array substrate, and projection pattern formed by an orthographic projection of the packaging adhesive layer in a thickness direction of the cover plate at least partially overlaps the signal wire.

2. The display panel according to claim 1, wherein the plurality of light-transmitting areas is sequentially distributed in an extending direction of the signal wire, the plurality of light filled with the insulating layer, and comprises hollow areas penetrating the signal wire in a thickness direction.

3. The display panel according to claim 1, wherein the signal wire further comprises:
   a first signal wire segment that extends in a first direction X; and
   a second signal wire segment that, extends in a second direction Y, wherein the first signal wire segment and the second signal wire segment are sequentially connected end to end, and the first direction X and the second direction Y intersect each other.

4. The display panel according to claim 1, wherein, in the packaging area, the signal wire further comprises:
   a ground wire.

5. The display panel according claim 1, wherein the signal wire is formed as one or a combination of a linear structure, a curved structure, and a zigzag structure.

6. The display panel according claim 1, wherein the projection pattern formed by the orthographic projection of the packaging adhesive layer in the thickness direction of the cover plate covers the signal wire.

7. The display panel according to claim 1, wherein the cover plate further comprises:
   a conductive layer disposed in the packaging area, the conductive layer is disposed on a side of the signal wire layer away from the first substrate, and the conductive layer covers the signal wire located in the packaging area and is electrically connected to the signal wire.

8. The display panel according to claim 7, wherein the conductive layer is made of indium tin oxide.

9. The display panel according to claim 7, wherein the cover plate further comprises:
   a protective layer, the protective layer is disposed on a side of the conductive layer away from the first substrate, and at least a part of the conductive layer is embedded in the protective layer.

10. The display panel according to claim 1, wherein an auxiliary metal layer is provided on a side of the array substrate facing the cover plate, and a projection of the auxiliary metal layer on the cover plate at least partially overlaps the projection of the packaging adhesive layer on the cover plate.

11. The display panel according to claim 10, wherein the array substrate further comprises:
   a plurality of metal wires located in the packaging area, and the auxiliary metal layer is disposed in the same layer as any of the plurality of metal wires.

12. A display device, comprising the display panel according to claim 1.

13. The display device according to claim 12, wherein the display device is a micro light emitting diode display device.

* * * * *